(12) United States Patent
Kim (10) Patent No.: US 7,683,667 B2
(45) Date of Patent: Mar. 23, 2010

(54) LEVEL SHIFTER HAVING SINGLE VOLTAGE SOURCE

(75) Inventor: Min Hwahn Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 183 days.

(21) Appl. No.: 11/869,408

(22) Filed: Oct. 9, 2007

(65) Prior Publication Data

US 2008/0100341 A1    May 1, 2008

(30) Foreign Application Priority Data

Oct. 26, 2006   (KR) .................... 10-2006-0104258

(51) Int. Cl.
    *H03K 19/0175* (2006.01)
(52) U.S. Cl. .................... 326/63; 326/83; 327/333
(58) Field of Classification Search .................... 326/88, 326/63, 112, 119, 121, 86, 17; 327/333
    See application file for complete search history.

(56) References Cited

U.S. PATENT DOCUMENTS

| | | | |
|---|---|---|---|
| 6,084,459 A * | 7/2000 | Jeong | 327/333 |
| 6,191,617 B1 * | 2/2001 | Park | 326/83 |
| 6,448,814 B1 * | 9/2002 | Yoo | 326/83 |
| 6,717,452 B2 | 4/2004 | Carpenter et al. | |
| 7,009,424 B2 | 3/2006 | Khan et al. | |
| 2005/0110519 A1 | 5/2005 | Correale, Jr. et al. | |

* cited by examiner

*Primary Examiner*—Jean B Jeanglaude
(74) *Attorney, Agent, or Firm*—Sherr & Vaughn PLLC

(57) ABSTRACT

Embodiments relate to a level shifter which uses a single voltage source, has an excellent operation characteristic even when a difference between a low voltage and a high voltage is large, and can be easily designed. Embodiments relate to a level shifter for shifting a voltage level between an input terminal connected to a circuit block which operates by a low voltage source and an output terminal connected to a circuit block which operates by a high voltage source. In embodiments, the level shifter may include a pull-up PMOS and a pull-down NMOS, both of which are connected between the high voltage source and ground in the form of an inverter and have an output node connected to the output terminal. The level shifter may include a control node which is connected to inputs of the pull-up and pull-down NMOS in the form of the inverter. The level shifter may have an input gate for connecting the control node to the high voltage source or ground according to a voltage level of the input terminal. The level shifter may also include a first feedback chain which is connected between the control node and the input gate and disconnects the input gate and the high voltage source when the voltage level of the input terminal is high and the input gate connects the control node to ground.

20 Claims, 7 Drawing Sheets

LEVEL SHIFTER HAVING SINGLE VOLTAGE SOURCE

The present application claims priority under 35 U.S.C. 119 to Korean Patent Application No. 10-2006-0104258, filed on Oct. 26, 2006, which is hereby incorporated by reference in its entirety.

BACKGROUND

In an integrated circuit (IC), a System on Chip (SoC) may integrate a memory device, a logic device and a semiconductor IP on a chip. To reduce power consumption, a variety of voltages are used in different components. To allow the devices to exchange data, a level shifter or translator shifts the output voltage levels of one device or component to an appropriate input voltage level of a counterpart device. For example, when external voltages VDDL at 1.2 V and VDDH at 1.5 V and ground GND or VSS are supplied to a device in a chip, devices operating at 1.2 V must have outputs shifted to 1.5 V before being input into devices operating at 1.5 V. Conversely, devices operating at 1.5 V must have outputs shifted to 1.2 V before being input into devices operating at 1.2 V.

Figure 1:
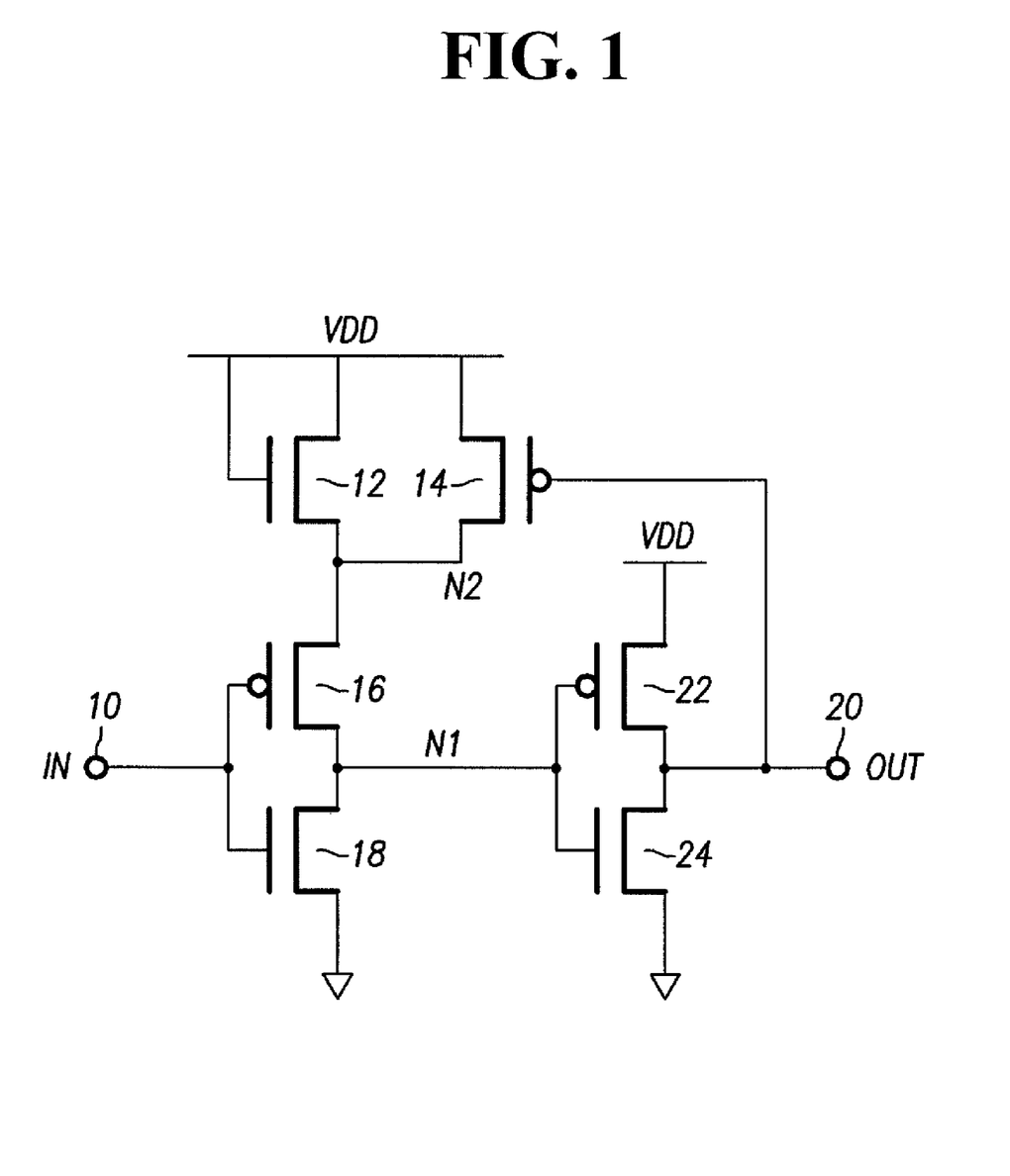
FIG. 1 is a circuit diagram of a level shifter.

FIG. 1 shows a single supply level converter. The level shifter shown in FIG. 1 includes an input inverter connected to an input terminal 10 and including a PMOS 16 and an NMOS 18, and an output inverter connected to an output terminal 20 and including a PMOS 22 and an NMOS 24. The input inverter and the output inverter are connected between ground and VDDH. That is, the level shifter shown in FIG. 1 shifts a low input voltage to a high output voltage only using a high voltage VDDH without using a low voltage VDDL.

The reason a level shift is possible is because the source (that is, a node N2) of the PMOS 16 included in the input inverter is connected to VDDH via an NMOS 12 which is configured in the form of a diode. Since the source of the PMOS 16 receives a voltage obtained by subtracting a threshold voltage Vt of the NMOS 12 from the high voltage VDDH, the same effect as supplying the low voltage VDDL to the input inverter can be obtained.

Since the source of the PMOS 16 included in the input inverter is also connected to VDDH via a PMOS 14 and the gate of the PMOS 14 is connected to the output terminal 20, the PMOS 14 is turned on when the output terminal 10 is low (that is, a low level signal is input to the input terminal 10) such that leakage current is reduced.

The level shifter shown in FIG. 1 is advantageous in that only a single voltage source is used and a leakage current characteristic is excellent.

However, if a voltage difference between a low voltage source and a high voltage source is large, the level shifting may become unstable or a malfunction may occur. This is because the voltage level of a node N2 (that is, the low voltage VDDL) is restricted by the threshold voltage of the NMOS 12 due to a diode structure in which the gate and drain of the NMOS 12 are connected to VDDH. Accordingly, the threshold voltage of the NMOS 12 having the diode structure has influence on the operation of the level shifter.

The level shifter shown in FIG. 1 is susceptible to electrostatic discharge (ESD) because the gate of the NMOS 12 is directly connected to the high voltage source VDDH.

Figure 2:
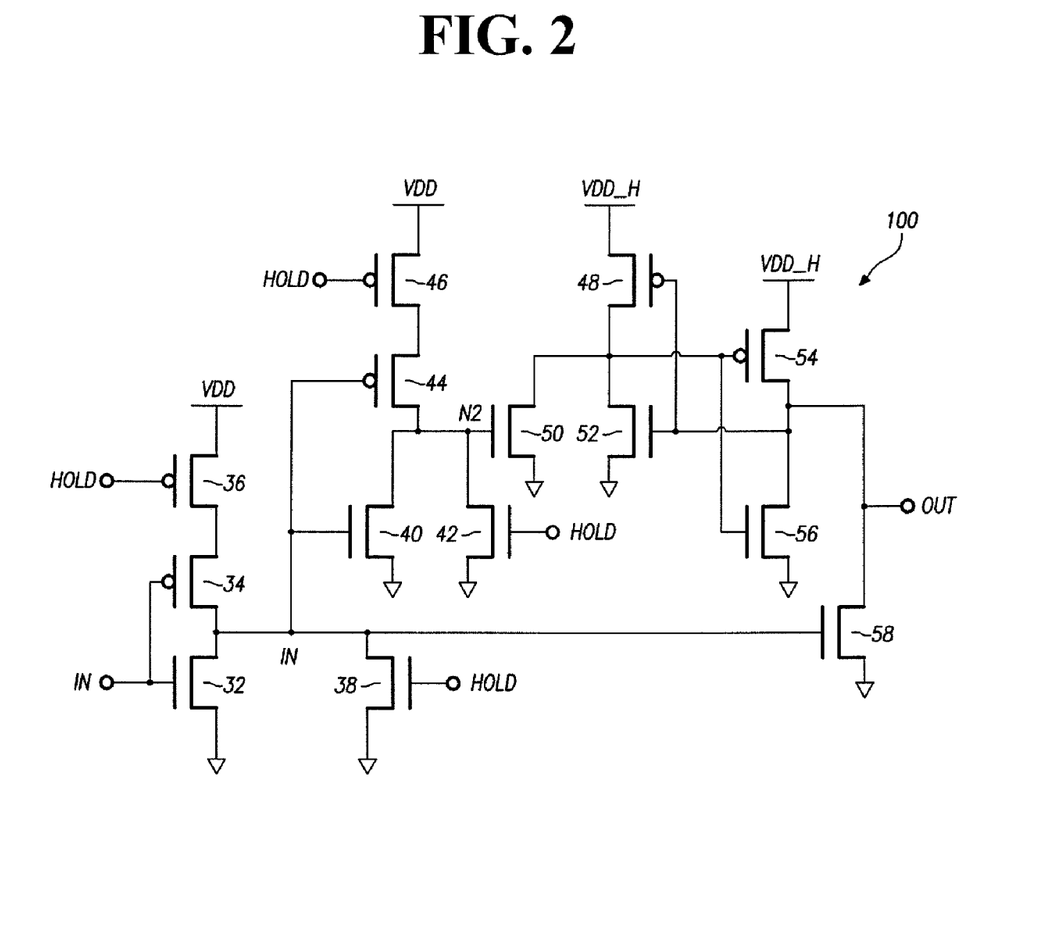
FIG. 2 is a circuit diagram of a level shifter.

FIG. 2 shows a level shifter. In FIG. 2, NMOSs 32 and 38 and PMOSs 34 and 36 form a NOR gate. When HOLD is high, an output node N1 of the NOR gate is held low. When HOLD is low, the output node N1 of the NOR gate is the logical inversion of an input signal IN. NMOSs 40 and 42 and PMOSs 44 and 46 form another NOR gate. When HOLD is high, the output node N2 of this NOR gate is held low. When HOLD is low, the output node N2 of this NOR gate has the same value as the input signal IN. A PMOS 48/NMOS 52 and a PMOS 54/NMOS 56 form a cross-coupled inverter which is a bit storage cell. When HOLD is high, both NOR gates have a low output value, the NMOS 50 and the NMOS 58 are turned off and thus the cross-coupled inverter maintains the state of the output signal OUT. When HOLD is low and the output node N1 is high, the NMOS 58 is turned on and the output signal OUT is pulled low. The inverter formed by the NMOS48/NMOS52 reinforces this condition. When HOLD is low and the output node N2 is high, the NMOS 50 is turned on, the input to the inverter formed by the PMOS 54/NMOS 56 is driven low, and the output signal OUT is driven high. The inverter formed by the PMOS 48/NMOS 52 reinforces this condition.

Since the level shifter shown in FIG. 2 uses two voltage sources including a low voltage source Vdd and a high voltage source Vdd_H, there are restrictions in the implementation and design of a cell. Since a low voltage source and a high voltage source are required when designing the cell, the size of the cell increases. The cell should be connected to both the low voltage source and the high voltage source, regardless of the position of the cell. Due to such a restriction, the cell should be placed in a boundary between a circuit block which operates by a low voltage and a circuit block which operates by a high voltage. Since a source line connected to the voltage source is placed in a routing region, it is disadvantageous in view of routing. Since an external signal is initiated at the cell, a block, in which the cell is placed, requires an additional area due to power routing of the low voltage source even at the time of performing a place-and-route (P&G) algorithm. In addition, there is a restriction in routing due to the restriction on the position of the cell.

Figure 3:
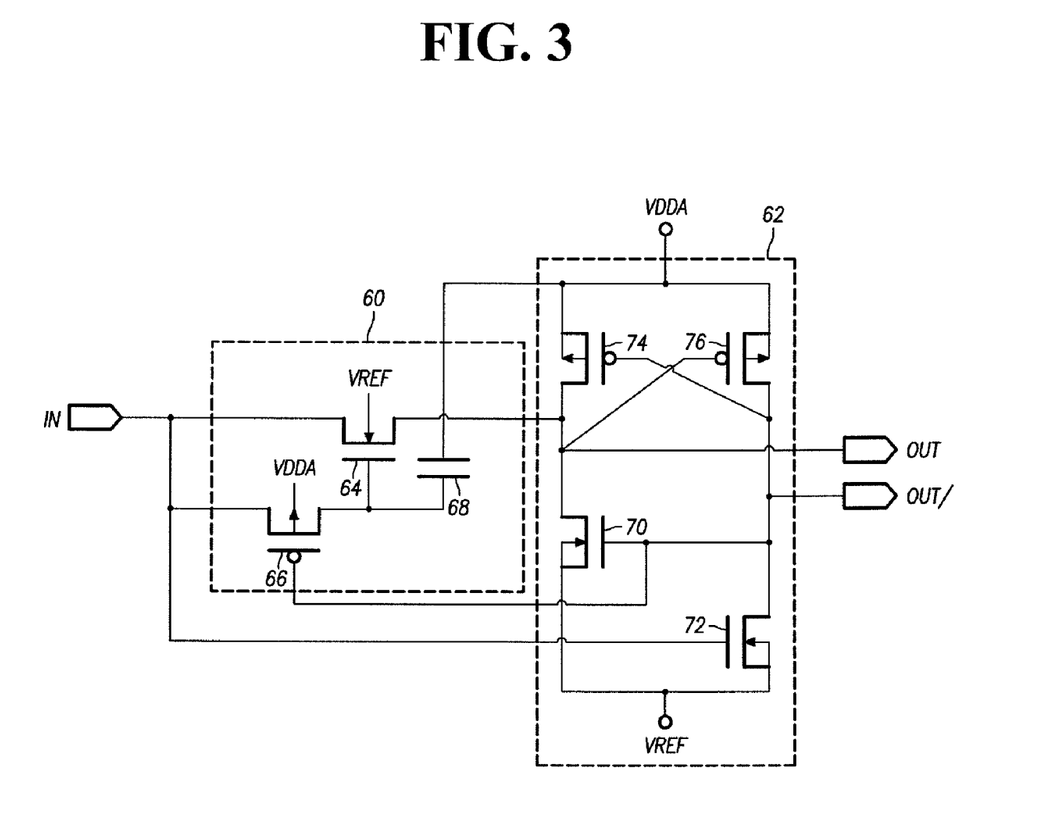
FIG. 3 is a circuit diagram of a level shifter.
Example

FIG. 3 shows a single supply level shifter. The level shifter shown in FIG. 3 includes an input stage 60 connected to a high voltage source VDDA and an input terminal IN and an output stage 62 connected to the high voltage source VDDA and an output terminal OUT. The input stage 60 includes an NMOS 64, a PMOS 66, and a capacitor 68, and the output stage 62 includes two NMOSs 70 and 72 and two PMOSs 74 and 76. When the signal of the input terminal IN is high (that is, VDD), the NMOS 72 of the output stage 62 is turned on and the drain of the NMOS 72 is pulled down to a reference voltage VREF. Then, the PMOS 66 of the input stage 60 is turned on such that the gate of the NMOS 64 is pulled up to VDD, and the NMOS 70 of the output stage 62 is turned on such that the output terminal OUT becomes VDDA. That is, the low voltage level of the input terminal IN is shifted to the high voltage level of the output terminal OUT. Next, when the signal of the input terminal IN is pulled down to the low level, the gate of the NMOS 64 is initially held at VDD. Accordingly, the signal of the output terminal OUT is pulled down to the low level by the NMOS 64 which is turned on. The PMOS 66 of the input stage 60 prevents the NMOS 64 from being turned off before the output terminal OUT is completely discharged. At the same time, the NMOS 70 of the output stage 62 is turned on to provide a positive feedback for the discharge of the output terminal OUT.

The level shifter shown in FIG. 3 can shift the voltage level between the input and the output using a single voltage source, but requires an additional circuit for the reference voltage source VREF. Such an additional circuit uses additional area when designing a standard cell and degrades routing efficiency of the signal input to the reference voltage source VREF.

SUMMARY

Embodiments relate to a level shifter which has a simplified structure implemented by a standard cell and can shift a voltage level using a single voltage source. Embodiments relate to a level shifter which can stably operate although a voltage difference between an input and an output is large. Embodiments relate to a level shifter which uses a single voltage source, has an excellent operation characteristic even when a difference between a low voltage and a high voltage is large, and can be easily designed.

Embodiments relate to a level shifter for shifting a voltage level between an input terminal connected to a circuit block which operates by a low voltage source and an output terminal connected to a circuit block which operates by a high voltage source. In embodiments, the level shifter may include a pull-up PMOS and a pull-down NMOS, both of which are connected between the high voltage source and ground in the form of an inverter and have an output node connected to the output terminal. The level shifter may include a control node which is connected to inputs of the pull-up and pull-down NMOS in the form of the inverter. The level shifter may have an input gate for connecting the control node to the high voltage source or ground according to a voltage level of the input terminal. The level shifter may also include a first feedback chain which is connected between the control node and the input gate and disconnects the input gate and the high voltage source when the voltage level of the input terminal is high and the input gate connects the control node to ground. The level shifter may further include a second feedback chain which is connected between the output terminal and the control node and connects the control node to the high voltage source when the voltage level of the input terminal is low and the input gate connects the control node to the high voltage source.

In embodiments, the input gate may include a first PMOS transistor with a gate connected to the input terminal, a source connected to the high voltage source, and a drain connected to the control node via the first feedback chain. A first NMOS transistor may have a gate connected to the input terminal, a source connected to ground, and a drain connected to the control node. The first feedback chain may include a second PMOS transistor with a gate connected to the control node and a drain connected to ground. A second NMOS transistor in the feedback chain may have a source connected to the control node and a drain connected to the drain of the first PMOS transistor. The source of the second PMOS transistor may be connected to the gate of the second NMOS transistor.

According to embodiments, the input gate may include a 2-1th PMOS transistor with a gate connected to the input terminal, a source connected to the high voltage source, and a drain connected to the control node via the first feedback chain. A 2-2th PMOS transistor may have a gate is connected to an enable terminal, a source connected to the high voltage source, and a drain connected to the control node via the first feedback chain. A 2-1th NMOS transistor may have a gate is connected to the input terminal and a source is connected to ground. A 2-2th NMOS transistor may have a gate connected to the enable terminal, a source connected to a drain of the 2-1th NMOS transistor, and a drain connected to the control node.

DESCRIPTION

Hereinafter, exemplary embodiments of a level shifter, which is capable of shifting a voltage level using a single voltage source even when a voltage difference is large, will be described with reference to the accompanying drawings.

Figure 4:
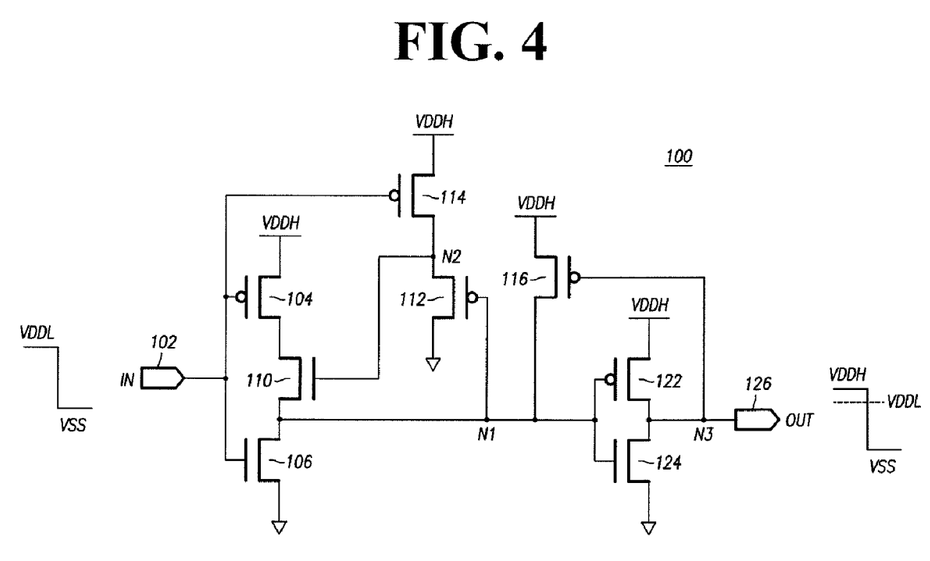
FIG. 4 is a circuit diagram of a level shifter according to embodiments.
Example

Example FIG. 4 is a circuit diagram of a level shifter according to embodiments. The level shifter 100 according to embodiments is a buffer type level shifter. In the level shifter 100, an input terminal 102 is connected to a circuit block powered by a low voltage source VDDL and an output terminal 126 is connected to a circuit block powered by a high voltage source VDDH.

As shown in example FIG. 4, the buffer type level shifter 100 includes a first PMOS 104 with the source connected to the high voltage source VDDH. First and second NMOSs 106 and 110 are connected between ground (VSS or GND) and the first PMOS 104 in series. The gate of the second NMOS 110 is connected between second PMOS 112 and a third PMOS 114, both of which are connected between ground and VDDH in series. A pull-up PMOS 122 and a pull-down NMOS 124 are connected between VDDH and ground in the form of an inverter. The input of the inverter is connected to a control node N1 and the output thereof is connected to the output terminal 126.

A fourth PMOS 116 is connected between the control node N1 and VDDH. The inputs of the first PMOS 104 and the second NMOS 106 are connected to the input terminal 102 and the outputs thereof are connected to the control node N1. Therefore, these form an "input gate".

When a high signal of the low voltage VDDL is input to the input terminal 102, the first NMOS 106 is turned on and the third PMOS 114 is turned off. By turning on the first NMOS 106, the control node N1 is pulled down to a ground level, the second PMOS 112 is turned on, and the node N2 is pulled down to the ground level.

Accordingly, the second NMOS 110 is turned off. The pull-up PMOS 122 is turned on by a low level at control node N1 such that VDDH is supplied to the output node N3. The fourth PMOS 116 is turned off by the output node N3 having a high level.

Since the high level signal of the input terminal 102 is the low voltage VDDL, the low voltage VDDL is supplied to the gate of the first PMOS 104 which has the source connected to VDDH. Accordingly, the first PMOS 104 is not completely turned off due to a difference between VDDH and VDDL.

Such a phenomenon becomes serious if the difference between VDDH and VDDL is large. Accordingly, leakage current flows via the first PMOS 104.

In embodiments, a feedback chain is placed such that leakage current of the first PMOS 104 does not have influence on the control node N1. That is, when the input signal 102 is high, the second NMOS 110 is turned off such that the supply of the current between the drain of the first PMOS 104 and the control node N1 is stopped. Accordingly, a low level signal is reliably supplied to the PMOS 122 for pulling up the output terminal 126 via the control node N1.

Meanwhile, when the low level signal is input to the input terminal 102, the first NMOS 106 is turned off and the first PMOS 104 is turned on such that VDDH is supplied to the drain of the second NMOS 110. Meanwhile, since the third PMOS 114 is turned on by the input signal having the low level such that VDDH is supplied to the node N2, the second NMOS 110 is turned on and thus the control node N1 becomes VDDH. Accordingly, the pull-down NMOS 124 is turned on and the output node N3 becomes low. The output node N3, held at the low level, turns on the fourth PMOS 116 to reinforce that control node N1 holds at VDDH. That is, the fourth PMOS 116 is the feedback chain which operates when the input signal 102 is low.

Figure 5:
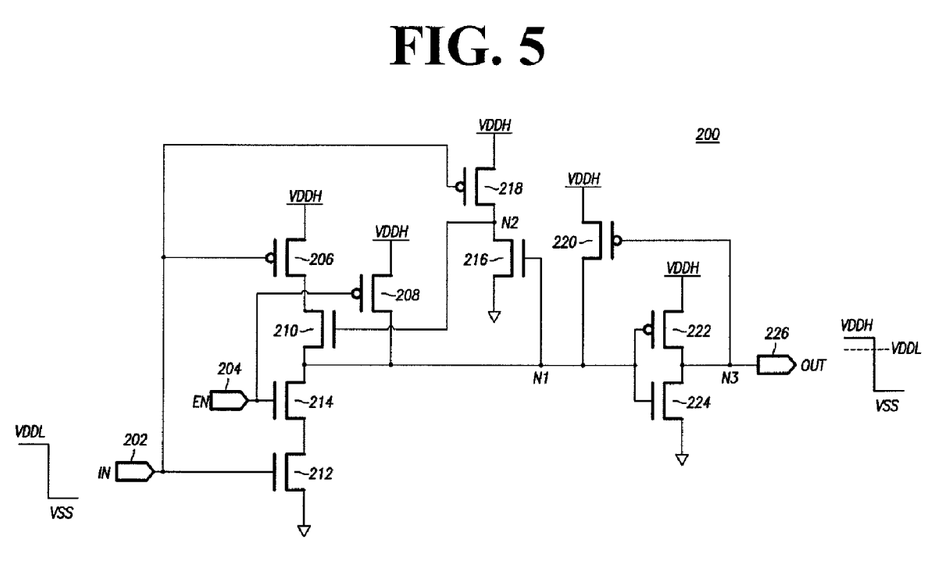
FIG. 5 is a circuit diagram of a level shifter according to embodiments.
Example

Example FIG. 5 is a circuit diagram of a level shifter according to embodiments. The level shifter 200 according to embodiments is different from the level shifter 100 according to other embodiments in that the input gate is configured in the form of a NAND gate, instead of the inverter (or the buffer), and an enable signal EN is used. That is, a first NMOS 212, a second NMOS 214 and a first PMOS 206, all of which form the NAND gate, and a second PMOS 208 are connected between VDDH and ground. The first NMOS 212 and the second NMOS 214 are connected to the second PMOS 208 and to the first PMOS 206 via the third NMOS 210, to form a feedback chain used for preventing leakage current. The enable signal EN is supplied to the gate of the second NMOS 214 and the gate of the second PMOS 208.

When the enable signal EN is high, the level shifter 200 performs a level shift operation and, when the enable signal EN is low, the output signal OUT is always low. When the input signal IN is high and the enable signal EN is high, the control node N1 becomes low and the second PMOS 208 is turned on. Accordingly, the output node N3 becomes VDDH. Accordingly, the output signal OUT supplied via the output terminal 226 becomes VDDH.

High input signal IN at VDDL is also supplied to the gate of the first PMOS 206. Since the source of the first PMOS 206 is connected to VDDH, leakage current due to a voltage difference between VDDH and VDDL flows in the first PMOS 206. Accordingly, the feedback chain, including the third PMOS 216 and the third NMOS 210, prevents the control node N1 from being influenced by leakage current. That is, since the third PMOS 216 is turned on by the control node N1 having a low level, the node N2 becomes VSS and the third NMOS 210 is turned off, so the drain of the second PMOS 216 is separated from the control node N1.

When the input signal IN is low and the enable signal EN is high, the first NMOS 212 is turned off and the first PMOS 206 is turned on. Accordingly, the node N4 becomes high through the first PMOS 206, the node N2 becomes high through the fourth PMOS 218, and the third NMOS 210 is turned on. Accordingly, the control node N1 becomes high, the pull-down NMOS 224 is turned on, and the output node N3 becomes low. The low level of the control node N1 is enhanced by the fifth PMOS 220 of the feedback chain.

Figure 6:
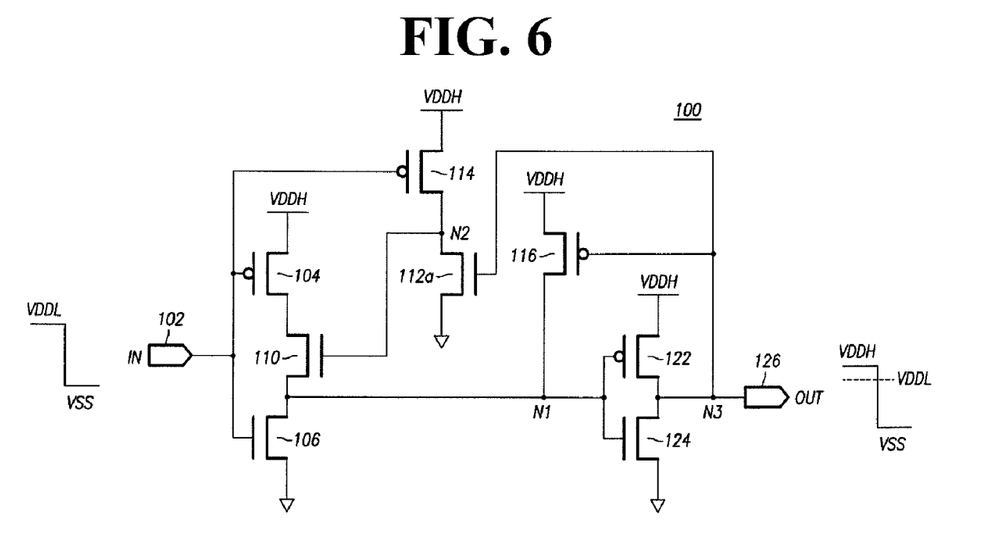
FIG. 6 is a circuit diagram of a level shifter according to embodiments.
Example

Example FIG. 6 is a circuit diagram of a level shifter according to embodiments.

The level shifter according to embodiments is a modified example of the level shifter according to the first embodiment. The same components as the first embodiment are denoted by same reference numerals and thus the detailed description thereof will be omitted.

Referring to example FIG. 6, the third embodiment is different from the first embodiment in that an NMOS 112a is used instead of the PMOS 112 such that a voltage input to the gate of the NMOS 110, used for preventing leakage current when the input signal IN is high, reliably turns off the NMOS 110. The gate of the NMOS 112a is connected to the output terminal 126 or the output node N3, the source thereof is connected to ground, and the drain thereof is connected to the gate of the NMOS 110. Such a configuration allows leakage current due to the connection between the PMOS 104 and the NMOS 106 to be strictly restricted when the input signal is high. However, since a reaction time of the output terminal 126 is required after the input signal IN is applied, it takes a small amount of time to completely turn off the NMOS 110.

Figure 7:
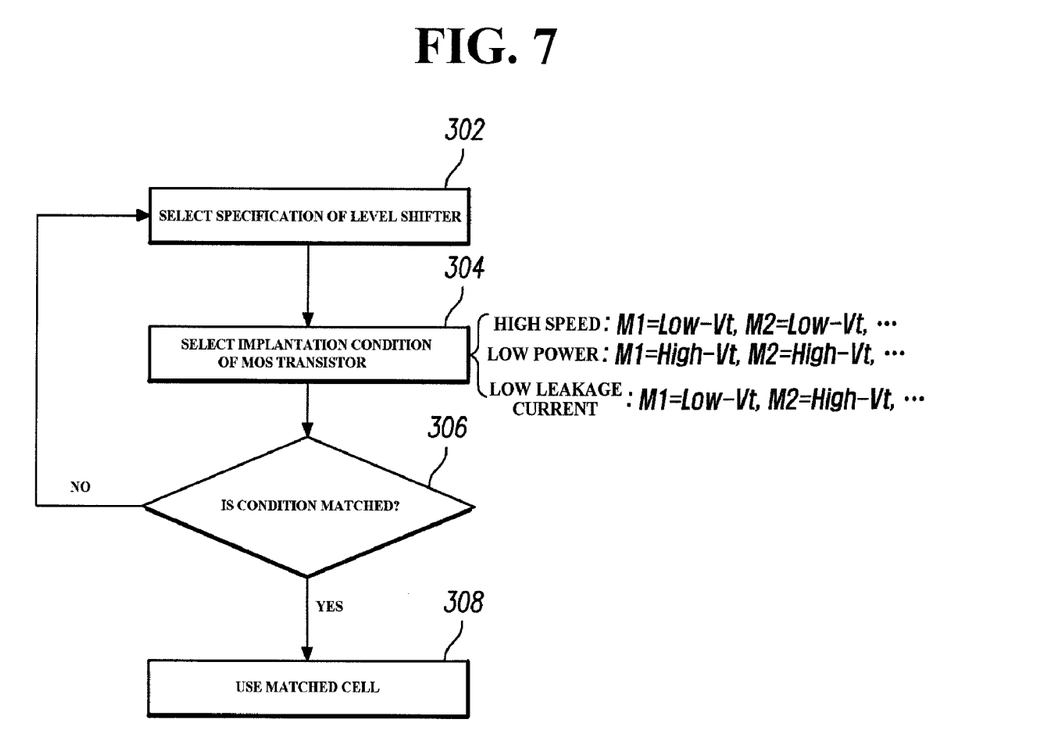
FIG. 7 is a flowchart illustrating a process of designing a semiconductor device using a library including level shifter cells developed according to embodiments.

Example FIG. 7 is a flowchart illustrating a process of designing a semiconductor device using a library including level shifter cells developed according to embodiments. A plurality of level shifters included in a standard cell library is previously designed by a variety of implantation conditions to have different specifications according to speed, leakage current, and power consumption. The implantation determines the threshold voltage Vt of the transistor. If the threshold voltage Vt increases, the leakage current and the speed decreases. Accordingly, if high speed is required, the implantation is performed such that the threshold voltage Vt becomes low. Since the power of a chip is proportional to the square of a supply voltage, power consumption decreases but the speed of the transistor decreases if the supply voltage decreases. A desired specification may be selected from the different specifications of the plurality of level shifters according to the characteristics of a semiconductor device to be designed (step 302).

The implantation condition of a MOS transistor included in the level shifter is selected (step 304). If a high-speed operation is required, a MOS transistor implantation condition having a low threshold voltage is selected. If a low-power level shifter is required, a MOS transistor implantation condition having a high threshold voltage is selected. If low leakage current is required, a MOS transistor implantation condition having an intermediate voltage between the low threshold voltage and the high threshold voltage is selected. It may then be determined whether the selected condition is matched to the specification of the level shifter (step 306). If not, the process returns to the step 302. If so, the level shifter (also called a "cell") is used (step 308).

In this case, the MOS transistor is selected according to the implantation condition of the MOS transistor and the implantation condition is determined to be matched to the specification of the level shifter, under the condition that all the plurality of MOS transistors included in the level shifters of the standard cell library have identical layers except for the implantation condition. Accordingly, the standard cell library may be configured in a simple table according to the characteristics of the implantation condition. Since the characteristics of the level shifters are stored and a desired level shifter is easily selected from them using only the implantation condition, it is possible to design the semiconductor device by a simple procedure.

Since the level shifter according to embodiments uses only a single voltage source, a layout becomes simple when an actual cell is designed. In a step of placing a cell, the cell can be placed at any position of a block using a high voltage. In addition, since a low voltage source is not used, an additional area necessary for the routing of a low voltage source is not required and problems locating a routing region can be prevented.

In embodiments, since any level shifter can be properly selected from cells which are previously manufactured and have an identical layout according to the implantation condition, the cell is selected according to the input specifications such as speed, leakage current and power consumption. As a result, the design of the semiconductor device is simple and the design flexibility of the semiconductor device is improved by ensuring a wide region.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a pull-up PMOS transistor and a pull-down NMOS transistor connected in series between a high voltage source and ground as an inverter, and having an output node connected to an output terminal;
   a control node which is connected to inputs of the pull-up PMOS transistor and pull-down NMOS transistor;
   an input gate for connecting the control node to the high voltage source or ground according to a voltage level of the input terminal; and
   a first feedback chain which is connected between the control node and the input gate such that when the voltage level of the input terminal is high, the feedback chain disconnects a path from the high voltage source to the control node via the input gate, while the input gate connects the control node to ground.

2. The apparatus of claim 1, comprising a second feedback chain which is connected between the output terminal and the control node and connects the control node to the high voltage source when the voltage level of the input terminal is low and the input gate connects the control node to the high voltage source.

3. The apparatus of claim 2, wherein the input gate comprises:
   a first PMOS transistor with a gate connected to the input terminal, a source connected to the high voltage source, and a drain connected to the control node via the first feedback chain; and
   a first NMOS transistor with a gate connected to the input terminal, a source connected to ground, and a drain connected to the control node.

4. The apparatus of claim 3, wherein:
   the first feedback chain comprises a second PMOS transistor with a gate connected to the control node and a drain connected to ground and a second NMOS transistor with a source connected to the control node and a drain connected to the drain of the first PMOS transistor, and
   the source of the second PMOS transistor is connected to the gate of the second NMOS transistor.

5. The apparatus of claim 2, wherein the second feedback chain comprises a fourth PMOS transistor with a gate is connected to the output terminal, a source connected to the high voltage source, and a drain connected to the control node.

6. The apparatus of claim 2, wherein the input gate comprises:
   a 2-1th PMOS transistor with a gate is connected to the input terminal, a source connected to the high voltage source, and a drain connected to the control node via the first feedback chain, and a 2-2th PMOS transistor with a gate connected to an enable terminal, a source connected to the high voltage source, and a drain connected to the control node via the first feedback chain; and
   a 2-1th NMOS transistor with a gate connected to the input terminal and a source connected to ground, and a 2-2th NMOS transistor with a gate connected to the enable terminal, a source connected to a drain of the 2-1th NMOS transistor, and a drain connected to the control node.

7. The apparatus of claim 6, wherein:
   the first feedback chain comprises a second PMOS transistor with a gate connected to the control node and a drain connected to ground and a second NMOS transistor with a source connected to the control node and a drain connected to the drain of the first PMOS transistor, and
   a source of the second PMOS transistor is connected to a gate of the second NMOS transistor.

8. The apparatus of claim 1, wherein the first feedback chain comprises an NMOS transistor with a source connected to ground, a gate connected to the output terminal, and a drain connected to the gate of the input inverter.

9. The apparatus of claim 1, wherein the input gate comprises:
   a first PMOS transistor with a gate connected to the input terminal, a source connected to the high voltage source, and a drain connected to the control node via the first feedback chain; and
   a first NMOS transistor with a gate connected to the input terminal, a source connected to ground, and a drain connected to the control node.

10. The apparatus of claim 9, wherein:
    the first feedback chain comprises a second PMOS transistor with a gate connected to the control node and a drain connected to ground and a second NMOS transistor with a source connected to the control node and a drain connected to the drain of the first PMOS transistor, and
    the source of the second PMOS transistor is connected to the gate of the second NMOS transistor.

11. The apparatus of claim 1, wherein the input gate comprises:
    a 2-1th PMOS transistor with a gate is connected to the input terminal, a source connected to the high voltage source, and a drain connected to the control node via the first feedback chain, and a 2-2th PMOS transistor with a gate connected to an enable terminal, a source connected to the high voltage source, and a drain connected to the control node via the first feedback chain; and
    a 2-1th NMOS transistor with a gate connected to the input terminal and a source connected to ground, and a 2-2th NMOS transistor with a gate connected to the enable terminal, a source connected to a drain of the 2-1th NMOS transistor, and a drain connected to the control node.

12. The apparatus of claim 11, wherein:
    the first feedback chain comprises a second PMOS transistor with a gate connected to the control node and a drain connected to ground and a second NMOS transistor with a source connected to the control node and a drain connected to the drain of the first PMOS transistor, and
    a source of the second PMOS transistor is connected to a gate of the second NMOS transistor.

13. A method comprising:
    manufacturing a level shifter for shifting a voltage level between an input terminal connected to a circuit block which operates by a low voltage source and an output terminal connected to a circuit block which operates by a high voltage source, by:
    selecting a specification of a level shifter;
    selecting an implant condition of a MOS transistor forming the transistor;
    determining whether a preselected condition is matched;
    using the implant condition to form a cell of the level shifter if the preselected condition is matched; and selecting a different specification of a level shifter if the preselected condition is not matched.

14. The method of claim 13, wherein the preselected condition is relatively high speed operation.

15. The method of claim 14, wherein the implant condition is selected for a relatively low threshold voltage MOS transistor.

16. The method of claim 13, wherein the preselected condition is relatively low power operation.

17. The method of claim 16, wherein the implant condition is selected for a relatively high threshold voltage MOS transistor.

18. The method of claim 13, wherein the preselected condition is relatively low leakage current operation.

19. The method of claim 18, wherein the implant condition is selected for an intermediate threshold voltage MOS transistor.

20. The method of claim 13, wherein a level shifter is formed as a cellular unit, and a library of cells may be combined in a circuit containing a plurality of circuit blocks requiring voltage level shifting for device interoperation.

* * * * *